(12) United States Patent  
Farnsworth

(10) Patent No.: US 7,786,780 B2  
(45) Date of Patent: Aug. 31, 2010

(54) CLOCK DOUBLER CIRCUIT AND METHOD

(75) Inventor: Timothy L. Farnsworth, Sheffield (GB)

(73) Assignee: Jennic Limited, Sheffield (GB)

( * ) Notice: Subject to any disclaimer, the term of this patent is extended or adjusted under 35 U.S.C. 154(b) by 44 days.

(21) Appl. No.: 11/827,088

(22) Filed: Jul. 10, 2007

(65) Prior Publication Data

US 2009/0015300 A1   Jan. 15, 2009

(51) Int. Cl.
H03K 3/017 (2006.01)
H03K 5/04 (2006.01)
H03K 7/08 (2006.01)

(52) U.S. Cl. ............................. 327/175; 327/119
(58) Field of Classification Search .............. 327/119, 327/175
See application file for complete search history.

(56) References Cited

U.S. PATENT DOCUMENTS

| | | | | |
|---|---|---|---|---|
| 5,045,800 A | * | 9/1991 | Kung | 327/176 |
| 5,394,020 A | * | 2/1995 | Nienaber | 327/140 |
| 5,502,419 A | * | 3/1996 | Kawasaki et al. | 332/109 |
| 6,091,271 A | * | 7/2000 | Pant et al. | 327/122 |
| 6,384,652 B1 | * | 5/2002 | Shu | 327/175 |

* cited by examiner

Primary Examiner—Lincoln Donovan  
Assistant Examiner—John W Poos  
(74) Attorney, Agent, or Firm—Wilmer Cutler Pickering Hale and Dorr LLP

(57) ABSTRACT

Apparatus for producing a signal, comprising a capacitor; a first current source for one of charging and discharging the capacitor over a first time period; a second current source for one of discharging and charging the capacitor over a first portion of a second time period; a detector for detecting when the voltage across the capacitor is substantially a first voltage and controlling the second current source for a second portion of the second time period to substantially maintain the voltage across the capacitor; and an apparatus output for indicating when the voltage across the capacitor is one of above and below the first voltage.

7 Claims, 6 Drawing Sheets

CLOCK DOUBLER CIRCUIT AND METHOD

FIELD OF THE INVENTION

Embodiments of the invention relate to a method and apparatus for producing a signal, for example for producing a clock signal from a clock signal of a lower frequency.

BACKGROUND OF THE INVENTION

Many electronic devices make use of at least one clock signal to synchronize the operation of various parts of the circuit and for timing/counting purposes. This signal usually has a very accurate frequency and duty cycle (that is, the frequency and duty cycle are substantially constant) and may be generated, for example, by passing the sinusoidal output of a crystal oscillator circuit through a comparator circuit to convert it to a digital signal.

Many electronic devices also make use of a clock frequency multiplier circuit to generate a higher frequency signal than the clock signal. A typical clock multiplier circuit 100, as shown in FIG. 1, may use a phase locked loop (PLL) including a phase detector 102, low pass filter 104, voltage controlled oscillator (VCO) 106 and a divide by N circuit 108. An input clock signal is provided to the phase detector 102. By keeping the output of the divide by N circuit 108 in-phase with the input 110, the output 112 from the VCO will have a frequency $N*F_{in}$, where $F_{in}$ is the frequency of the input clock signal. The operation of phase locked loops can be understood from, for example, B. Razavi, "*Monolithic Phase-locked loops and clock recovery circuits*", IEEE press, 1996, the contents of which are incorporated herein by reference for all purposes. The PLL-based circuit 100 has a high circuit complexity and power consumption.

A simpler clock frequency doubling circuit 200, which doubles the frequency of a clock signal (that is, produces a clock signal of twice the frequency of an input clock signal) is shown in FIG. 2. The circuit 200 includes an input clock signal 202 which is provided to a first input of a XOR gate 204. The input 202 is also provided to a delay cell 206 which delays the signal by a predetermined amount, and then provides it to a second input of the XOR gate 204. The output 208 of the XOR gate 204 comprises a clock signal with a higher frequency than the input clock signal. As shown in FIG. 3, the output 300 from the delay cell is delayed by a time T relative to the clock signal input 202. The output 208 of the XOR gate 204 comprises a clock signal where the signal is high when the signals 202 and 300 are not at the same logic level. The output 208 has a frequency which is double that of the input 202, and the pulses have a width of T. Therefore, the duty cycle is defined by the delay cell 206. In practice, the delay cell may be poorly defined, which can make a desired duty cycle (such as, for example, a duty cycle of 50%) difficult to achieve.

It is an object of embodiments of the invention to at least mitigate one or more of the problems of the prior art.

SUMMARY OF THE INVENTION

According to a first aspect of embodiments of the invention, there is provided apparatus for producing a signal, comprising a capacitor; a first current source for one of charging and discharging the capacitor over a first time period; a second current source for one of discharging and charging the capacitor over a first portion of a second time period; a detector for detecting when the voltage across the capacitor is substantially a first voltage and controlling the second current source for a second portion of the second time period to substantially maintain the voltage across the capacitor; and an apparatus output for indicating when the voltage across the capacitor is one of above and below the first voltage.

Thus, for example, the duty cycle of the apparatus output may be controlled by controlling the ratio of the current from the first current source to the current of the second current source. Therefore, if the ratio of the currents can be set accurately (that is, such that the ratio does not substantially change), then the duty cycle can also be set accurately.

In certain embodiments, the apparatus comprises a clock signal input for receiving a clock signal, wherein the first and second time periods are determined from the clock signal. In certain embodiments, the apparatus comprises a switch controlled by the clock signal for selectively connecting the first current source to the capacitor to one of charge and discharge the capacitor. Thus, a relatively simple implementation may be used to control the first time period and to determine the first voltage.

In certain embodiments, the detector comprises a comparator for comparing the voltage across the capacitor with a reference voltage. Preferably, the reference voltage is substantially the first voltage. Preferably, the apparatus output comprises an output from the comparator.

In certain embodiments, the first current source charges the capacitor over the first time period and the second current source discharges the capacitor over the first portion of the second time period. Alternatively, the first current source discharges the capacitor over the first time period and the second current source charges the capacitor over the first portion of the second time period.

According to a second aspect of embodiments of the invention, there is provided apparatus for producing a clock signal, comprising an input for receiving a clock signal; a first device for producing a first signal from the clock signal, whereby the first signal has a duty cycle less than a duty cycle of the clock signal; a clock signal modifier for producing a modified clock signal from the clock signal; a second device for producing a second signal from the modified clock signal, whereby the second signal has a duty cycle less than the duty cycle of the clock signal; and a signal combiner for combining the first and second signals to produce a combined signal, whereby the combined signal has a frequency higher than a frequency of the clock signal.

According to a third aspect of embodiments of the invention, there is provided device for producing a signal, comprising at least two apparatus as claimed in claim 1; a clock signal input for receiving a clock signal; at least one clock signal modifier for producing a modified clock signal from the clock signal and providing the modified clock signal to at least one of the at least two apparatus; a signal combiner for combining the apparatus outputs of the at least two apparatus to produce a combined signal such that the combined signal has a frequency higher than a frequency of the clock signal.

According to a fourth aspect of embodiments of the invention, there is provided method of producing a signal, the method comprising: one of charging and discharging a capacitor over a first time period; one of discharging and charging the capacitor over a first portion of a second time period; detecting when the voltage across the capacitor is substantially a reference voltage; controlling, as a result of the detecting, the charging or discharging of the capacitor in the second time period to maintain the voltage across the capacitor substantially at the reference voltage during a second portion of the second time period; and indicating when the voltage across the capacitor is substantially the reference voltage.

BRIEF DESCRIPTION OF THE DRAWINGS

Embodiments of the invention will now be described by way of example only, with reference to the accompanying drawings, in which.

DETAILED DESCRIPTION OF EMBODIMENTS OF THE INVENTION

Figure 1:
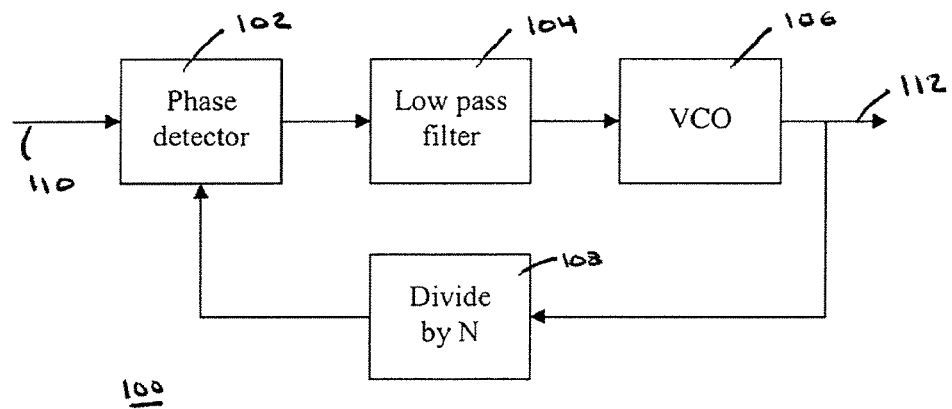
FIG. 1 shows an example of a known clock signal frequency multiplier.
Figure 2:
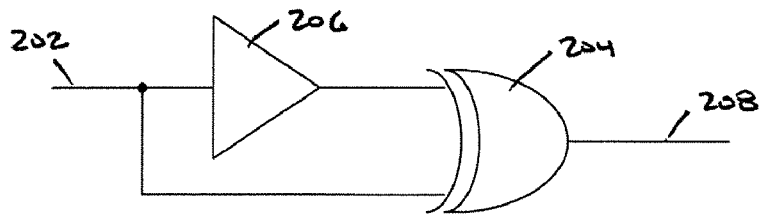
FIG. 2 shows an example of another known clock signal frequency multiplier.
Figure 3:
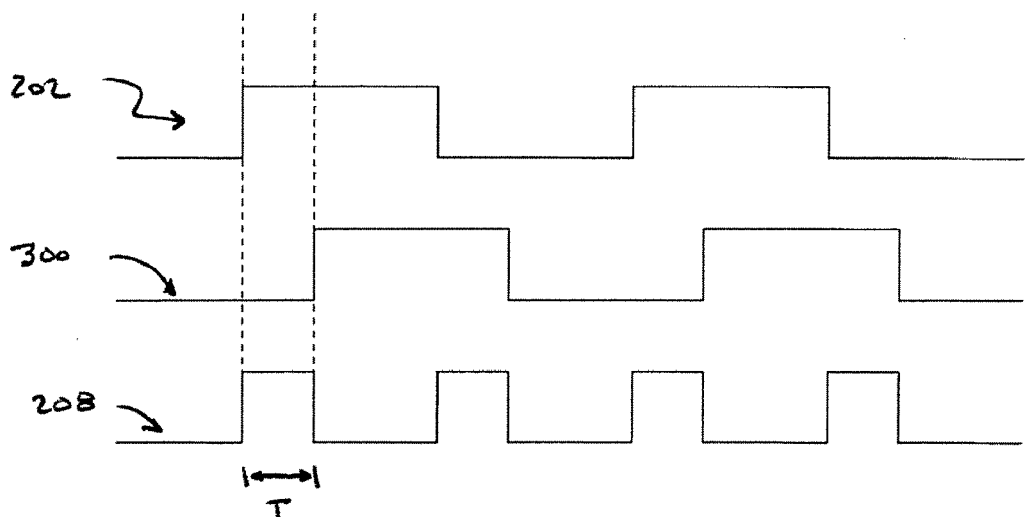
FIG. 3 shows an example of signals produced within the clock signal frequency multiplier of FIG. 2.
Figure 4:
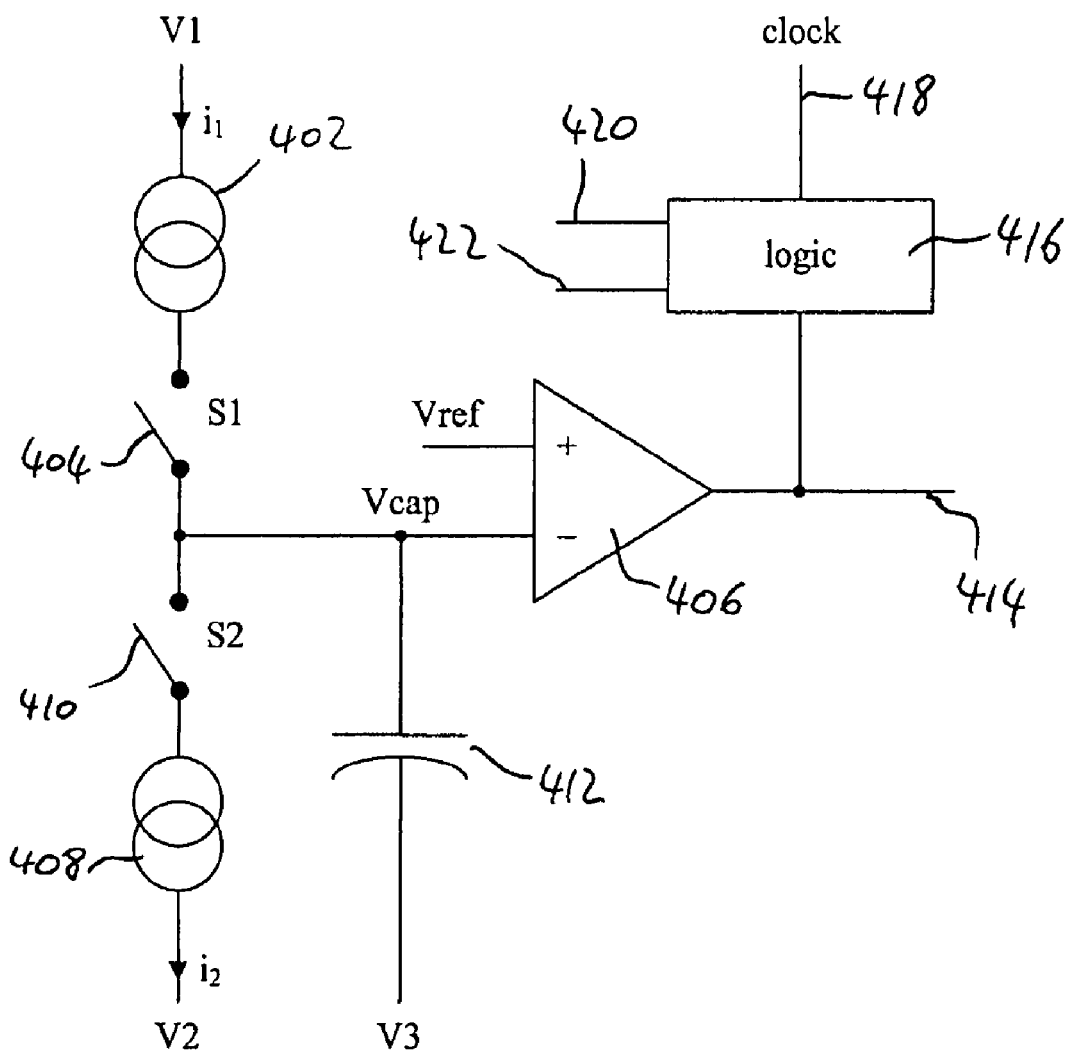
FIG. 4 shows apparatus for producing a signal according to embodiments of the invention.

FIG. 4 shows an example of apparatus 400 for producing a signal according to embodiments of the invention. The apparatus 400 comprises a first current source 402 and a first switch S1 404 connected in series between a first voltage V1 and the inverting input of a comparator 406. A second current source 408 and a second switch S2 410 are connected in series between the inverting input of the comparator 406 and a second voltage V2. A capacitor 412 is connected between the inverting input and a third voltage V3. In embodiments of the invention, the voltages V1, V2 and V3 are Vdd (a positive power supply voltage), Vss (a negative or ground power supply voltage) and Vss respectively, although in other embodiments of the invention the voltages may be rearranged and/or other voltages may be used.

A reference voltage Vref is provided to the non-inverting input of the op-amp 406. The output 414 of the comparator 406 comprises the output of the apparatus 400 and is also provided to a logic unit 416. The apparatus 400 includes an input 418 for a clock signal which is provided to the logic unit 416. The logic unit 416 includes a first output signal 420 for controlling the first switch S1 404, and a second output signal 422 for controlling the second switch S2 410. In embodiments of the invention, the output signal 420 from the logic unit 416 comprises the clock signal provided to the clock signal input 418, and the output signal 422 comprises the result of a logic NOR between the clock signal and the output 414 of the comparator 406.

The operation of the apparatus will now be described with reference to FIG. 5. A clock signal 500 is provided to the clock signal input 418 of the apparatus 400. The clock signal 500 comprises a digital signal that indicates one of a number of logic states. For example, the clock signal 500 may alternate between a first voltage and a second voltage that indicate a logic "high" and a logic "low" respectively. The clock signal 500 (and the output of the apparatus 400) describes a signal of this type and may or may not be used as a clock signal to other parts of the apparatus and/or another apparatus.

The clock signal 500 defines two time periods: a first time period 502, when the clock signal 500 is high (logic 1), and a second time period 504, when the clock signal 500 is low (logic 0). The first time period begins at time t1 and ends at time t2, whereas the second time period begins at time t2 and ends at time t4. Time t4 is also time t1 of the next cycle. During the first time period 502 the clock signal 500 is high, so that the signal 420 controlling the switch S1 404 is high and the signal 422 controlling the switch S2 410 is low. Therefore, the switch S1 404 is closed and the switch S2 410 is open. As a result, the first current source 402 pumps a first current $i_1$ into the capacitor 412, and the voltage Vcap 506 at the inverting input of the comparator 406 rises substantially linearly as shown in FIG. 5. During the first time period 502, the voltage Vcap is raised from the reference voltage Vref to a maximum voltage Vmax, which is the maximum voltage reached by Vcap. The voltage Vmax is determined by the current $i_1$ and the length of the first time period 502. During the first time period 502, the voltage Vcap is not less than the reference voltage Vref, and so the output 414 from the comparator 406 is low.

At the end of the first time period 502, at time t2, the clock signal 500 changes to low. The signal 420 controlling the switch S1 404 changes to low and the signal 422 controlling the switch S2 410 changes to high. Therefore, the switch S1 404 opens and the switch S2 410 closes. As a result, the second current source 408 sinks a second current $i_2$ from the capacitor 412, and the voltage Vcap 506 falls linearly during a first portion of the second time period 504, from time t2 to t3. At time t3, the voltage Vcap drops just below the reference voltage Vref (it can be said that Vcap is substantially equal to Vref, even though the comparator indicates when Vcap is less than Vref), and the output 414 of the comparator 406 changes to high. As a result, the signal 422 controlling the switch S2 410 changes to low, thus opening the switch S2 410. At this point, the current sources 402 and 408 are not connected to the capacitor 412, and hence the voltage Vcap at the inverting input of the comparator 406 remains substantially constant (i.e. the voltage Vcap—V3 across the capacitor is substantially maintained, and Vcap is maintained slightly below, or substantially equal to, Vref). This continues for a second portion of the second time period 504 from time t3 to time t4. At time t4 the clock signal 500 changes to high, and the voltage Vcap 506 begins to rise again. Thus, the time t4 is the time t1 of the next cycle.

Figure 5:
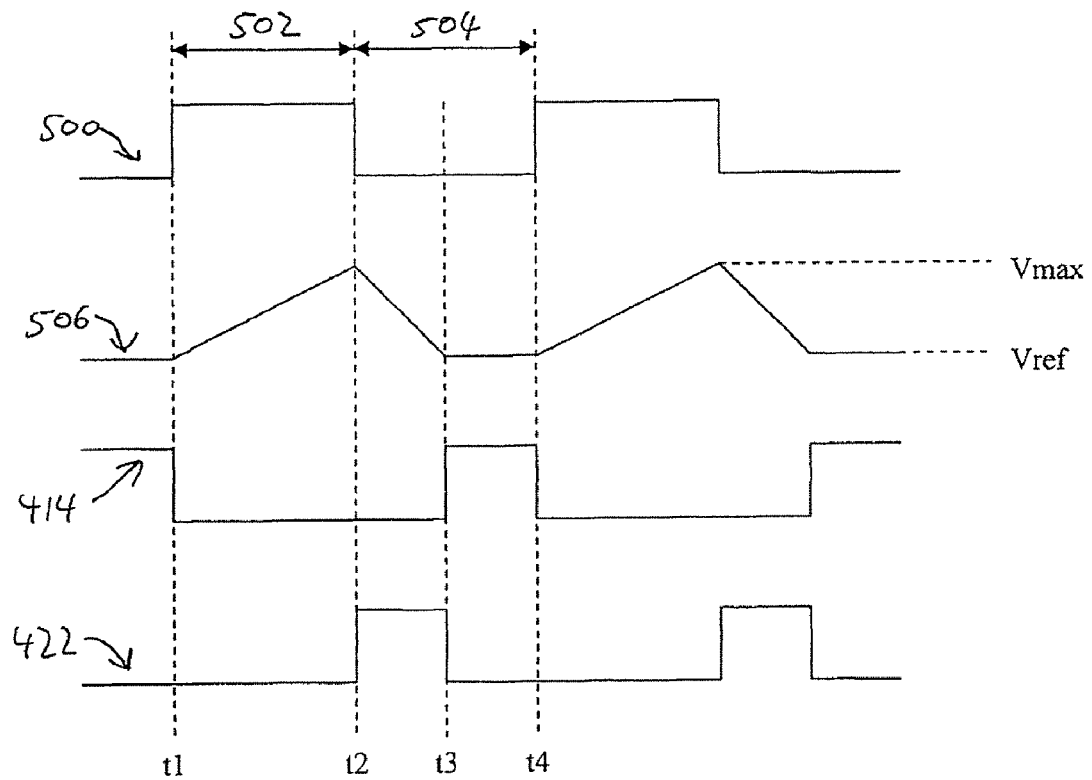
FIG. 5 shows an example of signals produced within the apparatus of FIG. 4.

As shown in FIG. 5, the output 414 from the comparator 406 (and hence the output from the apparatus 400) is high between times t3 and t4, and low the rest of the time. The length of time between t3 and t4 is determined by the ratio of the currents $i_1$ and $i_2$, as well as the period and duty cycle of the clock signal 500. Hence, the duty cycle of the output 414 can be determined from the ratio of currents as well as the duty cycle of the clock signal 500. In practice, it is possible to set the ratio of the currents $i_1$ and $i_2$ accurately (that is, the ratio of the currents does not change significantly due to, for example, manufacturing process and/or operating temperature variations), and so the duty cycle of the output 414 of the apparatus 400 can be set accurately (that is, the duty cycle of the output 414 does not change significantly).

For example, if the duty cycle of the input clock signal 500 is 50%, and the current $i_2$ is twice the current $i_1$, then the time t3 will occur halfway between times t2 and t4, and the duty cycle of the output 414 will be 25%. In other embodiments of the invention, the duty cycle and/or period of the input clock signal 500 may be different and/or the ratio of the currents may be different, and so the duty cycle of the output 414 may be different.

Figure 6:
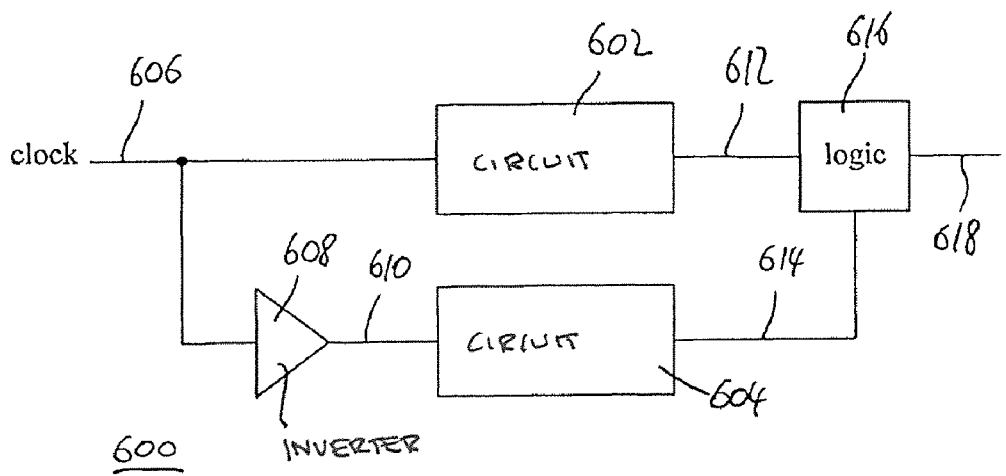
FIG. 6 shows an embodiment of a device according to embodiments of the invention for multiplying a clock signal frequency.

The output 414 from the apparatus 400 has the same frequency as the input clock signal 500. Therefore, to multiply the clock signal frequency, multiple instances of the apparatus 400 may be used. FIG. 6 shows an example 600 of a device 600 for multiplying a clock signal frequency. The device 600 includes a first apparatus 602 and a second apparatus 604, each being identical to the apparatus 400 shown in FIG. 4. As each apparatus 602 and 604 produces an output signal with a duty cycle of 25%, a clock signal with twice the frequency of the input clock signal can be produced by delaying one of the outputs by 50% and combining the two outputs. This is effectively done by inverting the clock signal input 606 using an inverter 608, and providing the clock signal input 606 to the first apparatus 602 while providing the output 610 of the inverter 608 to the second apparatus 604. The inverter 608 has the same effect of delaying the clock signal input to the second apparatus 604 by half a period of the clock signal, thus also delaying the output by half a period.

Figure 7:
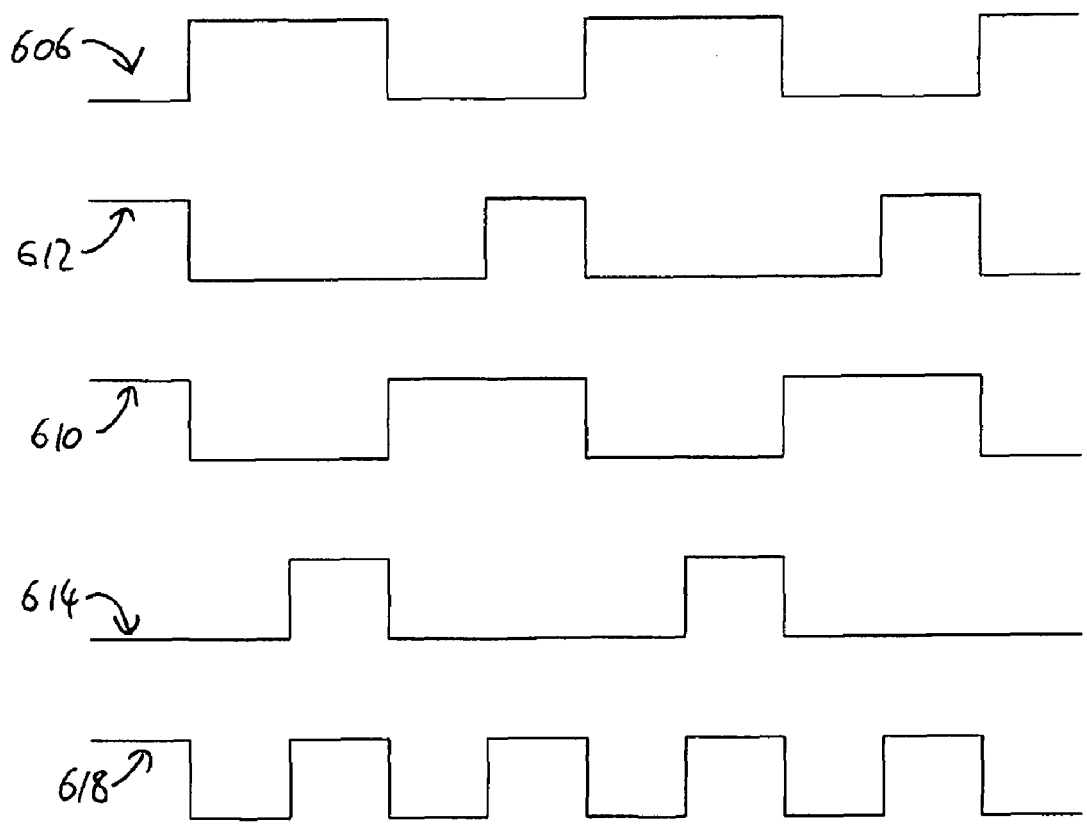
FIG. 7 shows an example of signals produced within the device of FIG. 6.

The outputs 612 and 614 of the first and second apparatus 602 and 604 respectively are provided to a logic unit 616 that combines the outputs 612 and 614 and provides the combined signal as an output 618. In embodiments of the invention, the logic unit 616 comprises a logic OR gate. FIG. 7 shows an example of the input clock signal 606, the output 612 from the apparatus 602, the output 610 from the inverter 608, the output 614 from the apparatus 604 and the output 618 from the logic unit 616, which also comprises the output of the device 600. It is evident that the output 618 has twice the frequency of the input clock signal 606. Furthermore, as the outputs 612 and 614 from the apparatus are accurate in terms of duty cycle, the duty cycle of the output 618 also has an accurate duty cycle.

Therefore, multiple apparatus (such as, for example, multiple instances of the apparatus 400 shown in FIG. 4) may be used to multiply a clock signal to produce a clock signal with a higher frequency and accurate duty cycle. For example, if it is desired to produce a clock signal with a frequency more than double that of an input clock signal, then more than two apparatus may be used. The input clock signal may be delayed by appropriate amounts when provided to respective apparatus and the duty cycle of the outputs of each apparatus may be set accordingly (using, for example, the ratio of currents $i_1$ and $i_2$ within each apparatus), and the logic to produce the combined output signal may be suitably implemented to produce the output signal (for example, an OR gate with more than two inputs may be used). In embodiments of the invention, the apparatus (such as apparatus 602 and 604 in the device 600 of FIG. 6) need not be identical, as long as the outputs of the apparatus can be combined to form the appropriate output signal.

The apparatus (such as the apparatus 400 shown in FIG. 4) or a device (such as the device 600 shown in FIG. 6) may be implemented as a single system. However, in alternative embodiments of the invention, any of the components may be part of an external system or apparatus. For example, where the system is an integrated circuit, any of the components may be located on another integrated circuit or otherwise. For example, one or both of the current sources and/or the capacitor may be implemented as part of an external system or apparatus. Therefore, for example, a current source may comprise a device that generates current, or alternatively may comprise another source of current such as an input to which a current generating device may be connected.

Various parts of embodiments of the invention may be implemented differently in alternative embodiments. A fundamental aspect of embodiments of the invention is the charging and discharging of the capacitor using a known ratio of currents and detecting when the voltage across the capacitor returns to its starting point, thus providing a well-defined point in time during each cycle of the input clock signal, which occurs at a point other than a state transition (for example, low to high or high to low) of the input clock signal. This point in time can be detected and used to construct a signal that may then be used to construct a clock signal with a higher frequency than the input clock signal. An error feedback system (such as in, for example, a phase locked loop) is not required.

For example, in alternative embodiments of the invention $i_1$ and $i_2$ may be reversed and/or swapped. Various parts of the apparatus may be implemented so as to accommodate these differences.

Furthermore, at least some of the absolute values within embodiments of the invention, such as, for example, the absolute values of Vref, $i_1$, $i_2$ and the capacitance of the capacitor are not important, as long as the ratio of $i_1$ to $i_2$ is accurate.

Figure 8:
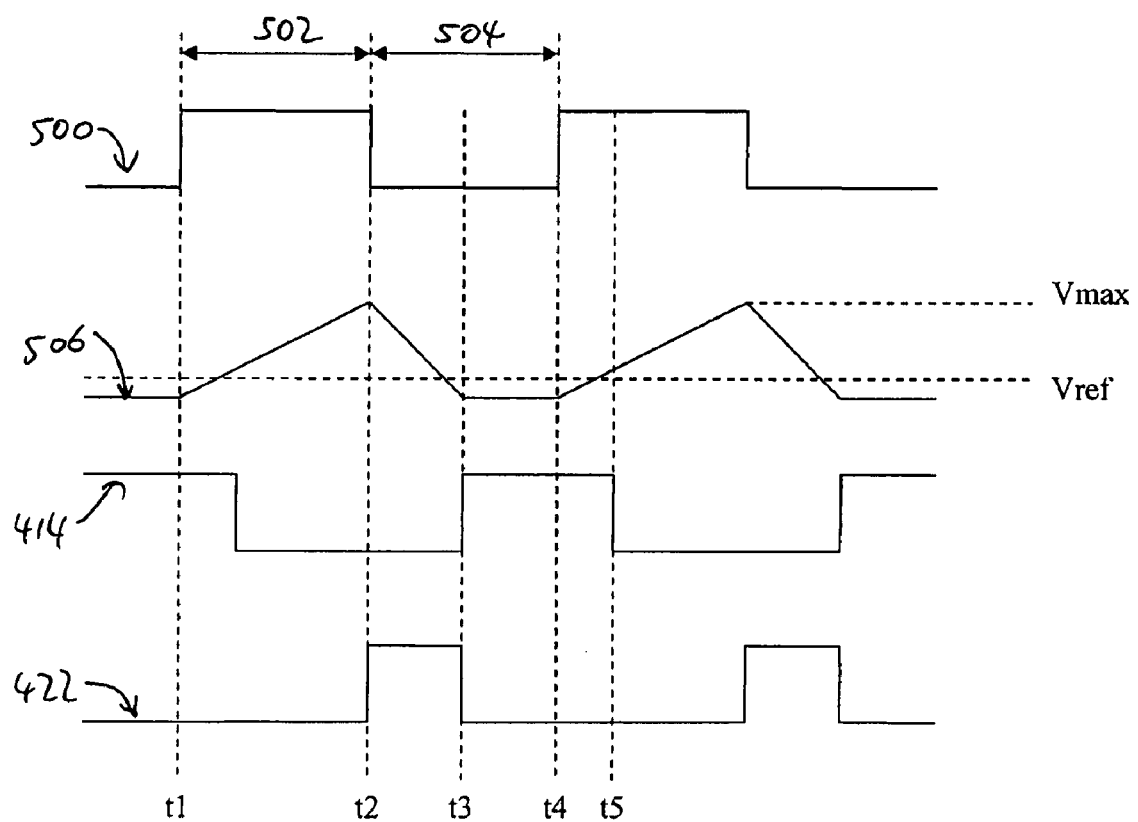
FIG. 8 shows another example of signals produced by the apparatus of FIG. 4.

FIG. 8 shows an example of signals within the apparatus 400 of FIG. 4 where the apparatus includes a non-ideal comparator 406, such that the comparator 406 has a delay in switching its output. At the start of a cycle, the voltage Vcap 506 is a little below the reference voltage Vref. At the end of the first time period 502, the voltage Vcap 506 reaches the maximum voltage Vmax, which is lower than the voltage Vmax shown in FIG. 5. During the first portion of the second time period 504, the voltage Vcap 506 drops back to a little less than Vref. The voltage Vcap 506 crosses Vref earlier than the time t3, but because of the delay (or offset) in the comparator 406, the output 414 of the comparator 406 changes from low to high at time t3, later than the crossing point. At the time t4, the input clock signal 500 changes from low to high, and the voltage Vcap 506 starts to rise again. The output 414 of the comparator 406 changes from high to low at time t5, which is a delay after the point where the voltage Vcap 506 crosses the reference voltage Vref again. During the second portion of the second time period 504, Vcap is slightly less than Vref, but is still fairly close to Vref, so can be said to be substantially equal to Vref.

As a result of the delay, the time period t3 still occurs midway between t2 and t4, provided that the first current $i_1$ is half that of the second current $i_2$. The duty cycle of the output 414 of the comparator 406 may be greater than that shown in FIG. 5 due to the delay. However, this may be corrected by setting the appropriate ratio of $i_1$ to $i_2$ (for example, by experimentation). Alternatively, the output 422 from the logic unit 416 can be used as the output from the apparatus 400, as it can be seen that the signal 416 in FIG. 8 is identical (except for the phase) to the signal 422 in FIG. 5. Similarly, the signal 422 can be used as the output when an ideal comparator is used.

Figure 9:
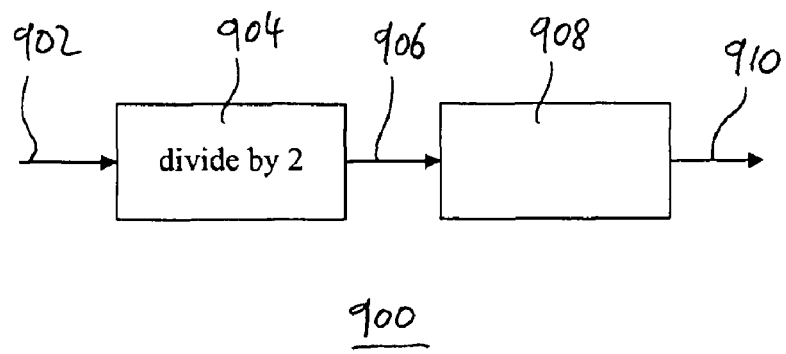
FIG. 9 shows a device for correcting a clock signal according to embodiments of the invention.
Figure 10:
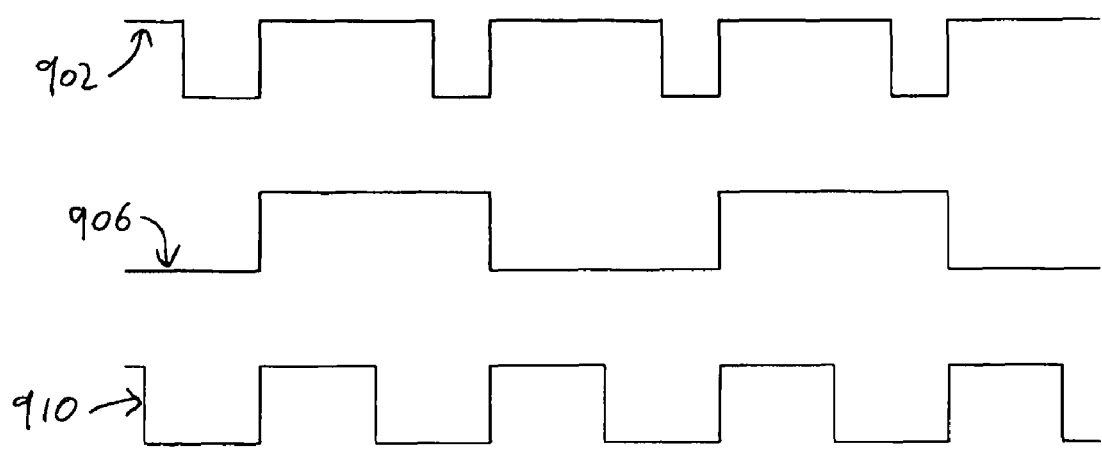
FIG. 10 shows an example of signals produced within the device of FIG. 9.

Embodiments of the invention may be used to correct the duty cycle of a clock signal. FIG. 9 shows an example of a device 900 for correcting the duty cycle of an input clock signal. The input clock signal 902 may have a duty cycle that is not a desired duty cycle (where the desired duty cycle is, for example, 50%), and/or the input clock signal 902 may have a variable duty cycle. The input clock signal 902 is provided to a divide by 2 unit 904 that produces a signal 906 with half the frequency of the input clock signal 902. The signal 906 has a 50% duty cycle and may be implemented, for example, using a flip-flop. The signal 906 is provided to a device 908 according to embodiments of the invention (for example, the device 908 may comprise the device 600 shown in FIG. 6). The output 910 of the device 908 has the same frequency as the input clock signal 902, but has a desired duty cycle (for example, 50%) that is also accurate. The duty cycle of the output 910 may be set by configuration of the device 908 and, in particular, by controlling the ratio of currents $i_1$ and $i_2$ within the device 908.

All of the features disclosed in this specification (including any accompanying claims, abstract and drawings), and/or all of the steps of any method or process so disclosed, may be combined in any combination, except combinations where at least some of such features and/or steps are mutually exclusive.

Each feature disclosed in this specification (including any accompanying claims, abstract and drawings), may be replaced by alternative features serving the same, equivalent or similar purpose, unless expressly stated otherwise. Thus, unless expressly stated otherwise, each feature disclosed is one example only of a generic series of equivalent or similar features.

The invention is not restricted to the details of any foregoing embodiments. The invention extends to any novel one, or any novel combination, of the features disclosed in this specification (including any accompanying claims, abstract and drawings), or to any novel one, or any novel combination, of the steps of any method or process so disclosed. The claims should not be construed to cover merely the foregoing embodiments, but also any embodiments which fall within the scope of the claims.

The invention claimed is:

1. Apparatus for producing a clock signal, comprising:
   an input for receiving a clock signal indicating one of a number of logic states;
   a first device for producing a first signal from the clock signal, whereby the first signal has a duty cycle less than a duty cycle of the clock signal;
   a clock signal modifier for producing a modified clock signal from the clock signal;
   a second device for producing a second signal from the modified clock signal, whereby the second signal has a duty cycle less than the duty cycle of the clock signal; and
   a signal combiner for combining the first and second signals to produce a combined signal, whereby the combined signal has a frequency higher than a frequency of the clock signal, wherein at least one of the first and second devices comprises:
   a capacitor;
   a first current source for one of charging and discharging the capacitor over a first time period determined from the clock signal;
   a second current source for one of discharging and charging the capacitor over a first portion of a second time period determined from the clock signal;
   a detector for detecting when the voltage across the capacitor is substantially a first voltage and controlling the second current source for a second portion of the second time period to substantially maintain the voltage across the capacitor, wherein the detector comprises a comparator for comparing the voltage across the capacitor with a reference voltage; and
   a device output comprising an output from the comparator for at least one of the first signal and the second signal such that the at least one of the first signal and the second signal indicates when the voltage across the capacitor is one of above and below the first voltage.

2. Apparatus as claimed in claim 1, wherein the at least one of the first and second devices comprises a clock signal input for receiving a clock signal, wherein the first and second time periods are determined from the clock signal.

3. Apparatus as claimed in claim 2, wherein the at least one of the first and second devices comprises a switch controlled by the clock signal for selectively connecting the first current source to the capacitor to one of charge and discharge the capacitor.

4. Apparatus as claimed in claim 1, wherein the reference voltage is substantially the first voltage.

5. Apparatus as claimed in claim 1, wherein the first current source charges the capacitor over the first time period and the second current source discharges the capacitor over the first portion of the second time period.

6. Apparatus as claimed in claim 1, wherein the first current source discharges the capacitor over the first time period and the second current source charges the capacitor over the first portion of the second time period.

7. A device for producing a signal, comprising:
   at least two apparatus as claimed in claim 1;
   a clock signal input for receiving a clock signal;
   at least one clock signal modifier for producing a modified clock signal from the clock signal and providing the modified clock signal to at least one of the at least two apparatus;
   a signal combiner for combining the apparatus outputs of the at least two apparatus to produce a combined signal such that the combined signal has a frequency higher than a frequency of the clock signal.

* * * * *